(12) United States Patent
Kai et al.

(10) Patent No.: US 11,069,643 B2
(45) Date of Patent: Jul. 20, 2021

(54) SEMICONDUCTOR DEVICE MANUFACTURING METHOD

(71) Applicant: FUJI ELECTRIC CO., LTD., Kawasaki (JP)

(72) Inventors: Kenshi Kai, Matsumoto (JP); Rikihiro Maruyama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/519,545

(22) Filed: Jul. 23, 2019

(65) Prior Publication Data
US 2020/0098717 A1 Mar. 26, 2020

(30) Foreign Application Priority Data

Sep. 21, 2018 (JP) .............................. JP2018-177889

(51) Int. Cl.
*H01L 23/00* (2006.01)
*H01L 21/48* (2006.01)
(Continued)

(52) U.S. Cl.
CPC ............ *H01L 24/27* (2013.01); *B23K 35/025* (2013.01); *B23K 35/262* (2013.01); *C22C 13/00* (2013.01);
(Continued)

(58) Field of Classification Search
CPC . H01L 24/27; H01L 21/4871; H01L 23/3735; H01L 24/29; H01L 24/32; H01L 224/2732; H01L 224/29209; H01L 224/29211; H01L 224/29213; H01L 224/29239; H01L 224/29247; H01L 224/29255; H01L 224/29263;
(Continued)

(56) References Cited

U.S. PATENT DOCUMENTS 5,621,243 A * 4/1997 Baba .................... H01L 23/3735
257/712
10,398,036 B2 8/2019 Kai et al.
(Continued)

FOREIGN PATENT DOCUMENTS

JP 2001-210771 A 8/2001
JP 2017-038019 A 2/2017
(Continued)

*Primary Examiner* — Mohammad M Choudhry
(74) *Attorney, Agent, or Firm* — Rabin & Berdo, P.C.

(57) ABSTRACT

A conductive plate has a front surface at a front side and a rear surface at a rear side. The front surface includes a first front surface on which a first arrangement region is disposed and a second front surface on which a second arrangement region is disposed. The first front surface has a height measured from the rear surface that is different from a height of the second front surface measured from the rear surface. Next, first and second bonding materials are respectively applied to the first and second arrangement regions. A first part is bonded to the first arrangement region via the first bonding material, and a second part is bonded to the second arrangement region via the second bonding material. The heights of the first and second arrangement regions set on the front surface on the conductive plate are different from each other.

12 Claims, 11 Drawing Sheets

(51) Int. Cl.
*B23K 35/02* (2006.01)
*B23K 35/26* (2006.01)
*C22C 13/00* (2006.01)
*H01L 23/373* (2006.01)

(52) U.S. Cl.
CPC ...... *H01L 21/4871* (2013.01); *H01L 23/3735* (2013.01); *H01L 24/29* (2013.01); *H01L 24/32* (2013.01); *H01L 2224/2732* (2013.01); *H01L 2224/29209* (2013.01); *H01L 2224/29211* (2013.01); *H01L 2224/29213* (2013.01); *H01L 2224/29239* (2013.01); *H01L 2224/29247* (2013.01); *H01L 2224/29255* (2013.01); *H01L 2224/29263* (2013.01); *H01L 2224/32225* (2013.01); *H01L 2924/014* (2013.01); *H01L 2924/0105* (2013.01); *H01L 2924/01028* (2013.01); *H01L 2924/01029* (2013.01); *H01L 2924/01032* (2013.01); *H01L 2924/01047* (2013.01); *H01L 2924/01049* (2013.01); *H01L 2924/01083* (2013.01)

(58) Field of Classification Search
CPC ... H01L 224/32225; H01L 2924/01083; H01L 2924/104
See application file for complete search history.

(56) References Cited

U.S. PATENT DOCUMENTS

| | | | |
|---|---|---|---|
| 2003/0224197 A1* | 12/2003 | Soga | B23K 35/262 428/570 |
| 2009/0194884 A1 | 8/2009 | Stolze | |
| 2013/0153279 A1* | 6/2013 | Hayashi | H05K 3/4673 174/260 |
| 2015/0340333 A1 | 11/2015 | Isozaki | |
| 2016/0027711 A1* | 1/2016 | Harada | H01L 23/3735 257/698 |
| 2017/0047280 A1 | 2/2017 | Tanaka et al. | |
| 2018/0279484 A1 | 9/2018 | Kai et al. | |
| 2019/0067251 A1* | 2/2019 | Bando | H01L 23/473 |

FOREIGN PATENT DOCUMENTS

| | | |
|---|---|---|
| JP | 2018160554 A | 10/2018 |
| WO | 2014/148319 A1 | 9/2014 |

* cited by examiner

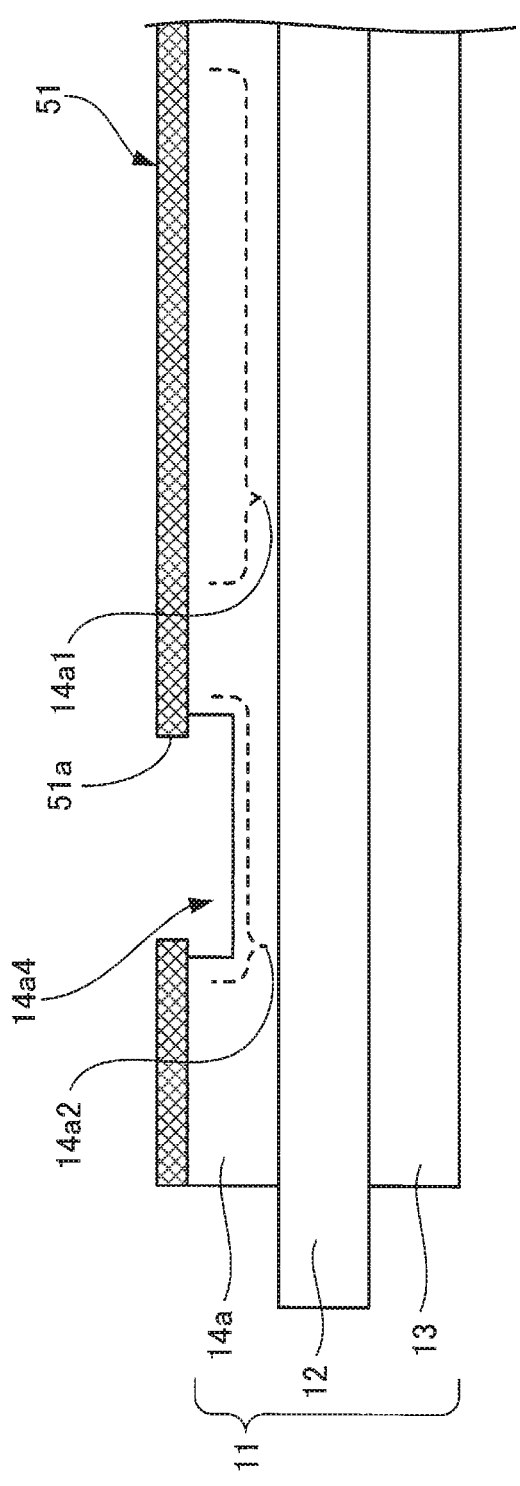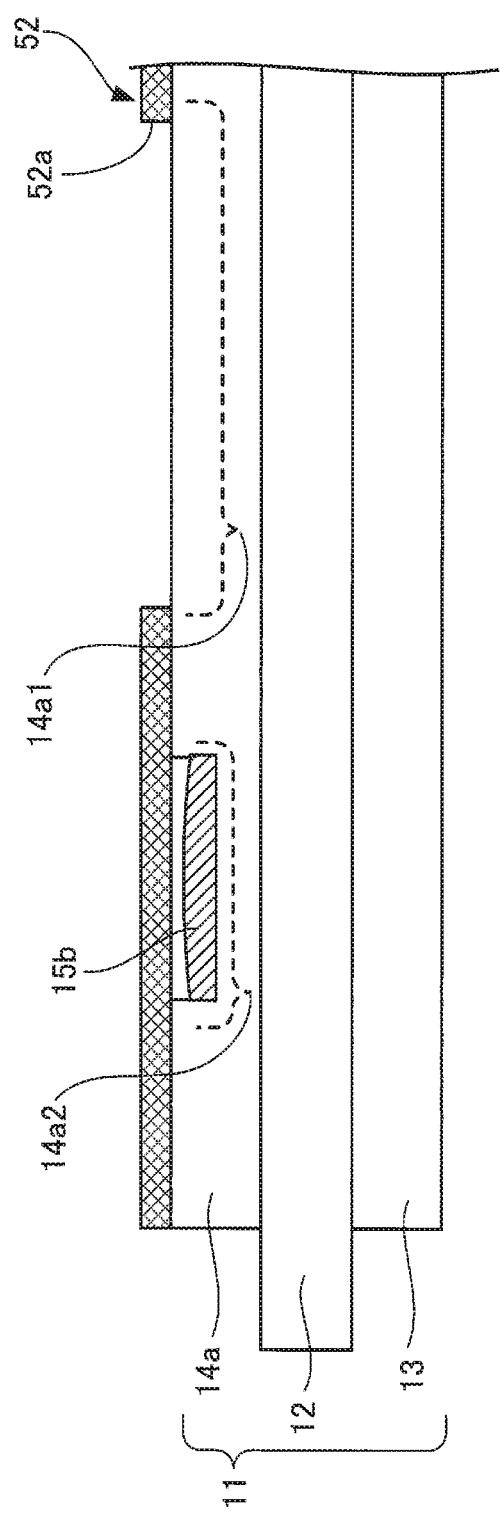
FIG. 5A
FIG. 5B

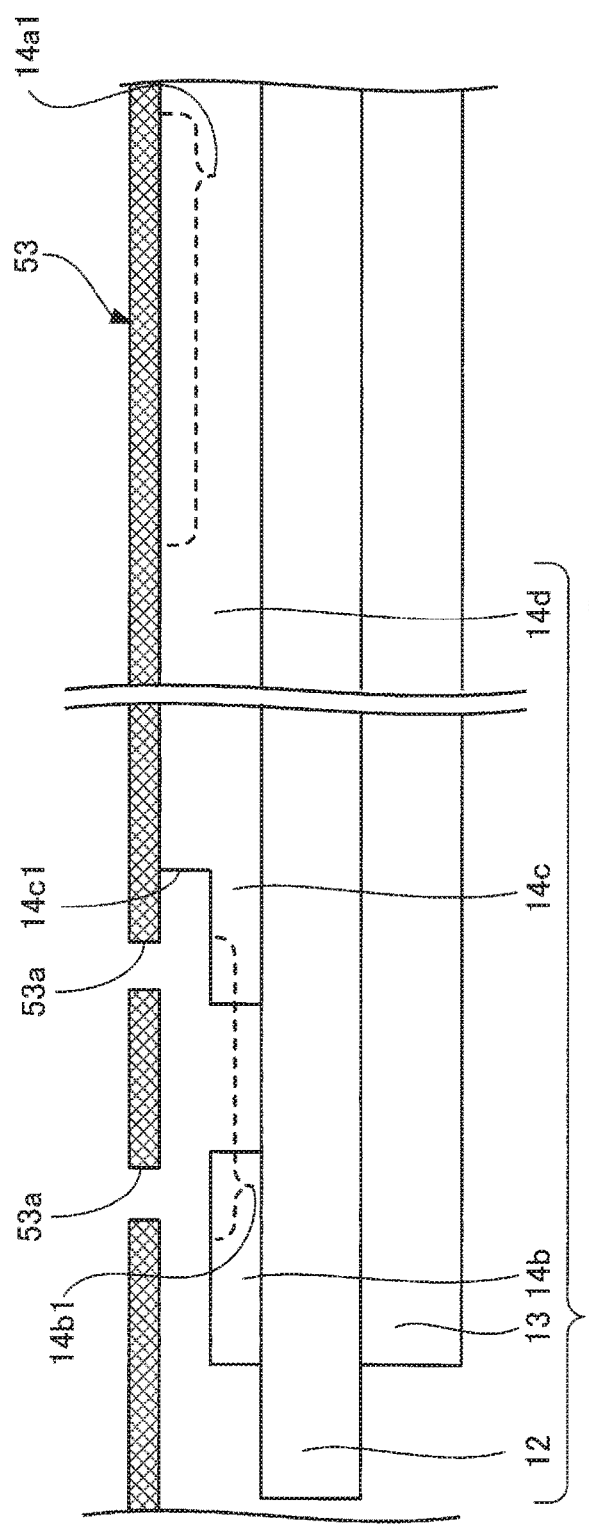
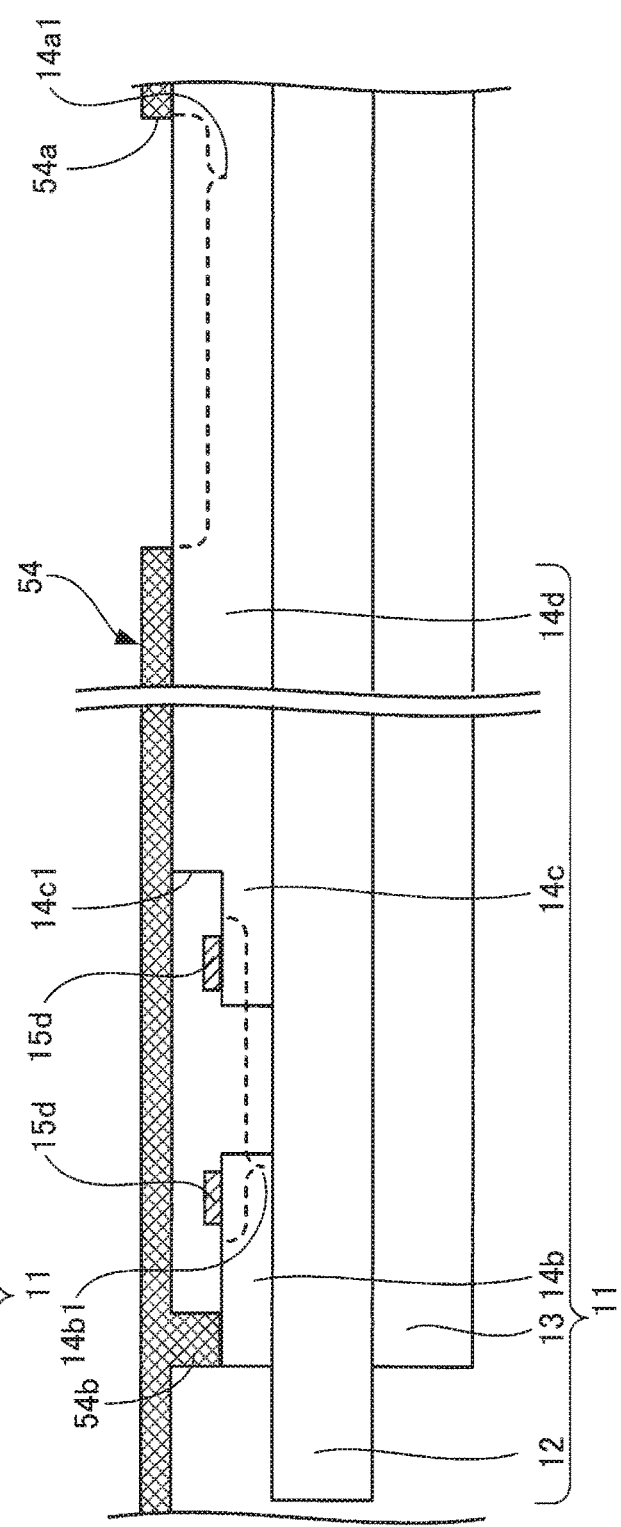
FIG. 8A
FIG. 8B

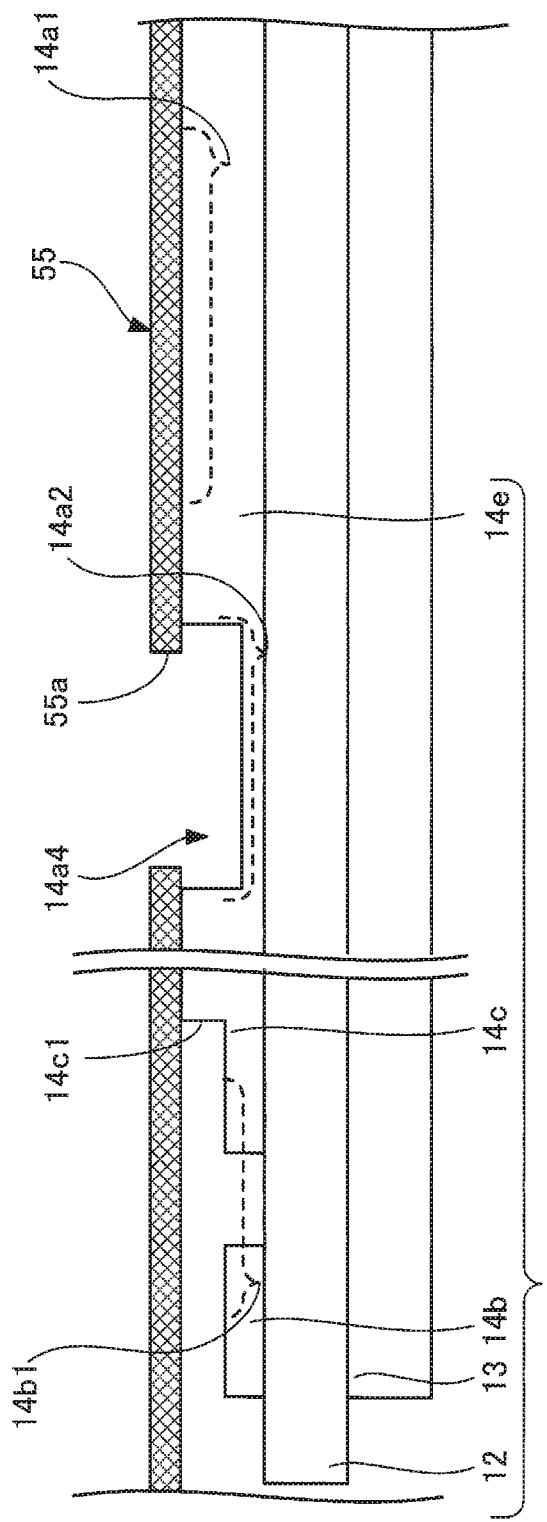
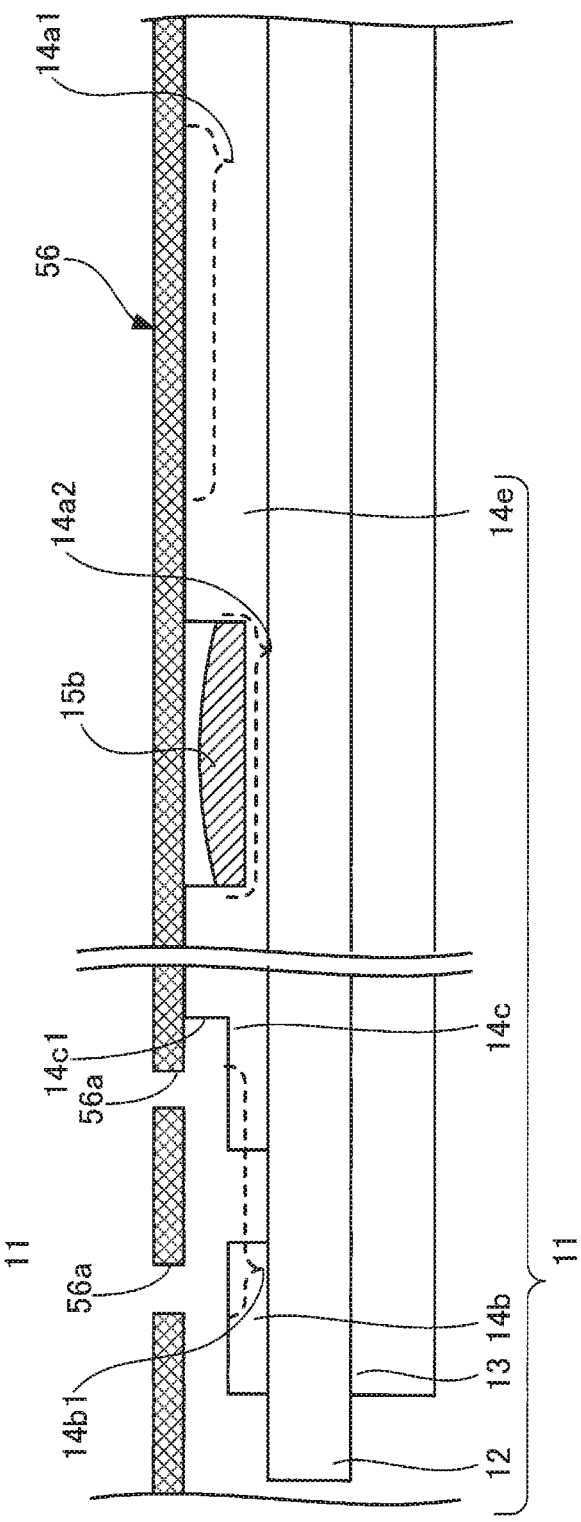
FIG. 10A
FIG. 10B

SEMICONDUCTOR DEVICE MANUFACTURING METHOD

CROSS-REFERENCE TO RELATED APPLICATION

This application is based upon and claims the benefit of priority of the prior Japanese Patent Application No. 2018-177889, filed on Sep. 21, 2018, the entire contents of which are incorporated herein by reference.

BACKGROUND OF THE INVENTION

1. Field of the Invention

The embodiments discussed herein are related to a semiconductor device manufacturing method.

2. Background of the Related Art

Semiconductor devices include, for example, semiconductor elements such as insulated gate bipolar transistors (IGBTs) or power metal oxide semiconductor field effect transistors (MOSFETs). These semiconductor devices are used as power conversion devices, for example.

Semiconductor devices include semiconductor chips including semiconductor elements as described above. Such a semiconductor chip is arranged on a conductive plate such as a circuit pattern. When this semiconductor device is manufactured, solder is applied to the arrangement region of an individual semiconductor chip on the conductive plate by permeographic printing such as screen printing or metal stencil printing. In permeographic printing, a mask having an opening corresponding to the individual arrangement region is arranged on the conductive plate, and paste-like solder is applied through the individual opening by using a squeegee. Thus, this solder application method using permeographic printing is advantageous in productivity and cost.

In addition, when a semiconductor device is manufactured, a part such as an external connection terminal or an electronic part is also arranged along with a semiconductor chip on a conductive plate, depending on the specifications of the semiconductor device. The semiconductor device consequently realizes desired functions and achieves improved convenience. See, for example, the following literatures.

International Publication Pamphlet No. WO 2014/148319
Japanese Laid-open Patent Publication No. 2017-038019

In permeographic printing, only a single kind of solder is applied. Thus, even when a plurality of parts of different kinds are arranged on a conductive plate to manufacture a semiconductor device, only a single kind of solder is applied to the arrangement regions of the individual parts on the conductive plate. However, among these different parts arranged in the respective arrangement regions on the conductive plate in this case, while some parts are suitably bonded to the conductive plate, other parts could be bonded inappropriately. Namely, inappropriate bonding could be made.

SUMMARY OF THE INVENTION

In one aspect of the embodiments, there is provided a semiconductor device manufacturing method, including: preparing a conductive plate having a front surface at a front side and a rear surface at a rear side opposite to the front side, the front surface including a first front surface on which a first arrangement region is disposed and a second front surface on which a second arrangement region is disposed, the first front surface having a height measured from the rear surface that is different from a height of the second front surface measured from the rear surface; applying a first bonding material to the first arrangement region and a second bonding material different from the first bonding material to the second arrangement region; and bonding a first part to the first arrangement region via the first bonding material and a second part to the second arrangement region via the second bonding material.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 5A and 5B illustrate a semiconductor device manufacturing method according to the second embodiment;

FIGS. 8A and 8B illustrate a semiconductor device manufacturing method according to the fourth embodiment;

FIGS. 10A and 10B illustrate a semiconductor device manufacturing method according to the fifth embodiment.

DETAILED DESCRIPTION OF THE INVENTION

Several embodiments will be described below with reference to the accompanying drawings.

First Embodiment

Figure 1A:
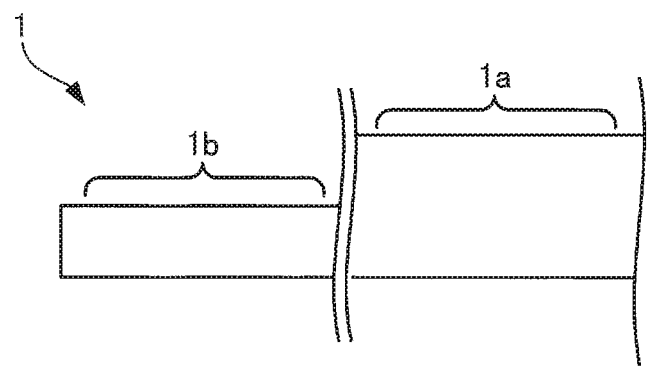
FIGS. 1A to 1C illustrate a semiconductor device manufacturing method according to a first embodiment.
Figure 1B:
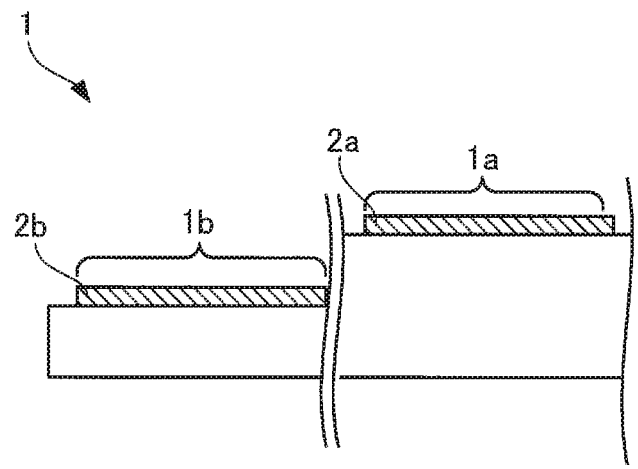
Figure 1C:
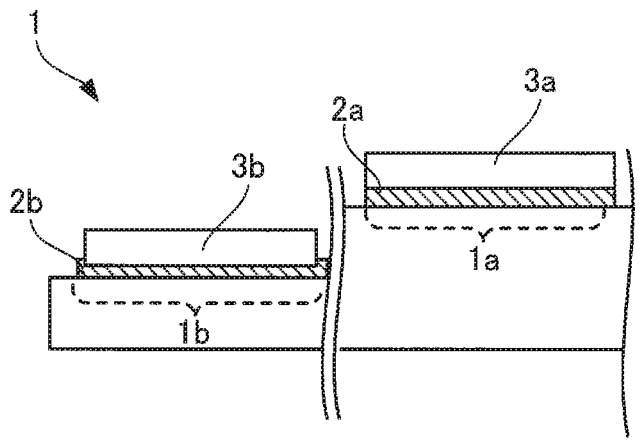
Figure 2A:
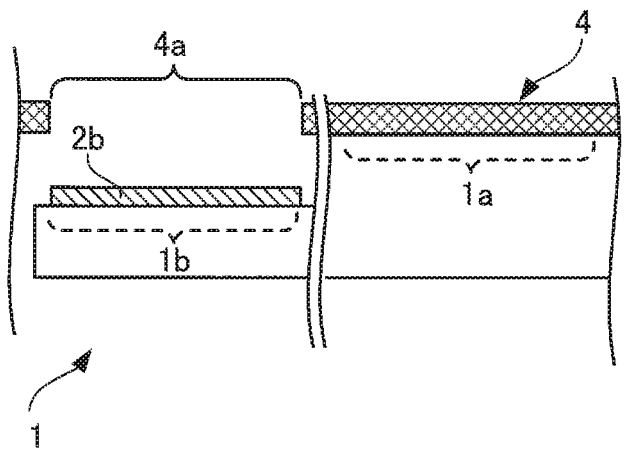
FIGS. 2A and 2B illustrate an application step in the semiconductor device manufacturing method according to the first embodiment.
Figure 2B:
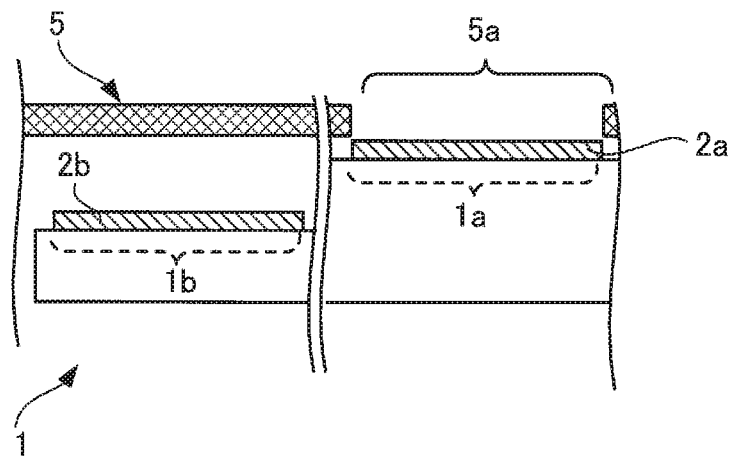

A semiconductor device manufacturing method according to a first embodiment will be described with reference to FIGS. 1A to 1C, 2A, and 2B. FIGS. 1A to 1C illustrate a semiconductor device manufacturing method according to a first embodiment. More specifically, FIGS. 1A to 1C illustrate a preparation step, an application step, and a bonding step, respectively, included in the semiconductor device manufacturing method. FIGS. 2A and 2B illustrate the application step in the semiconductor device manufacturing method according to the first embodiment. Each of FIGS. 1A to 1C, 2A, and 2B is a cross section of a main part of a semiconductor device being manufactured.

First, a conductive plate 1 is prepared. The conductive plate 1 is made of conductive material and has a plate-like shape. The conductive plate 1 may be used as a circuit pattern formed on a ceramic insulating plate or the like, a circuit pattern of a metal-based board, or a lead frame, for example. As illustrated in FIG. 1A, this conductive plate 1 has a front surface on which a first arrangement region 1a and a second arrangement region 1b positioned at a height different from that of the first arrangement region 1a are set. The regions set at the different heights may be formed by etching, pressing, or the like.

Next, as illustrated in FIG. 1B, first bonding material 2a is applied to the first arrangement region 1a, and second bonding material 2b different from the first bonding material 2a is applied to the second arrangement region 1b. As the application method used in this step, permeographic printing such as metal stencil printing or screen printing may be used. In addition, as the first bonding material 2a and the second bonding material 2b, paste-like solder or adhesive agent may be used. In addition, the solder used as the second bonding material 2b may be different from the solder used as the first bonding material 2a in the liquidus temperature, the amount of the flux material, or the component of the flux material, or any combination thereof. For example, the application step may be performed as follows. As illustrated in FIG. 2A, the second bonding material 2b is applied to the second arrangement region 1b by using a first mask 4 having a first opening 4a corresponding to the se cond arrangement region 1b set at the lower position. Next, as illustrated in FIG. 2B, after the first mask 4 is removed, the first bonding material 2a is applied to the first arrangement region 1a by using a second mask 5 having a second opening 5a corresponding to the first arrangement region 1a set at the higher position. In this way, different kinds of material suitable for a first part 3a and a second part 3b described below are selected for the first bonding material 2a and the second bonding material 2b applied to the first arrangement region 1a and the second arrangement region 1b. In addition, by changing the thicknesses of the first mask 4 and the second mask 5, different kinds of bonding material having different thicknesses may be applied to the first arrangement region 1a and the second arrangement region 1b. Consequently, the first bonding material 2a and the second bonding material 2b applied to the first arrangement region 1a and the second arrangement region 1b have different thicknesses suitable for the first part 3a and the second part 3b.

Next, the first part 3a is bonded to the first arrangement region 1a via the first bonding material 2a, and the second part 3b is bonded to the second arrangement region 1b via the second bonding material 2b. As the bonding method in this step, heat processing may be used. For example, first, by using a jig or the like, the first part 3a is arranged on the first arrangement region 1a via the first bonding material 2a, and the second part 3b is arranged on the second arrangement region 1b via the second bonding material 2b. Next, the first part 3a and the second part 3b are heated while fixed by the jig. Consequently, the first bonding material 2a and the second bonding material 2b are cured, and the first part 3a and the second part 3b are bonded to their respective regions. Since different kinds of material suitable for bonding of the first part 3a and the second part 3b are selected for the first bonding material 2a and the second bonding material 2b, the first part 3a and the second part 3b are suitably bonded to the first arrangement region 1a and the second arrangement region 1b.

As described above, in the above semiconductor device manufacturing method, first, the conductive plate 1 having the front surface on which the first arrangement region 1a and the second arrangement region 1b positioned at a height different from that of the first arrangement region 1a are set is prepared. Next, the first bonding material 2a is applied to the first arrangement region 1a, and the second bonding material 2b different from the first bonding material 2a is applied to the second arrangement region 1b. Next, the first part 3a is bonded to the first arrangement region 1a via the first bonding material 2a, and the second part 3b is bonded to the second arrangement region 1b via the second bonding material 2b. In this case, the height of the first arrangement region 1a and the height of the second arrangement region 1b set on the front surface of the conductive plate 1 are different from each other. Thus, for example, by selectively using different masks in permeographic printing, the different kinds of first bonding material 2a and second bonding material 2b suitable for the first part 3a and the second part 3b are applied to the first arrangement region 1a and the second arrangement region 1b, respectively. Thus, the first part 3a and the second part 3b are certainly bonded to the first arrangement region 1a and the second arrangement region 1b of the conductive plate 1, and the reliability of the semiconductor device is maintained.

In the first embodiment, the first arrangement region 1a is set at the higher front surface of the conductive plate 1, and the second arrangement region 1b is set at the low front surface of the conductive plate 1. Thus, in the application step illustrated in FIG. 1B (FIGS. 2A and 2B), the second bonding material 2b is first applied to the second arrangement region 1b set at the lower position, and the first bonding material 2a is next applied to the first arrangement region 1a set at the higher position than the second arrangement region 1b. However, the first embodiment is not limited to this example. For example, when the first arrangement region 1a is set at the lower position and the second arrangement region 1b is set at the higher position, the first bonding material 2a may be applied to the first arrangement region 1a first, and the second bonding material 2b may be applied to the second arrangement region 1b next. Namely, it is preferable that bonding material be applied to the arrangement region set at the lower position first and bonding material be applied to the arrangement region set at the higher position next. In addition, it is preferable that the height of the bonding material applied to the arrangement region set at the lower position be lower than the height of the arrangement region set at the higher position. Namely, it is preferable that the thickness of the bonding material applied to the arrangement region set at the lower position be less than the difference between the height of the higher position and the height of the lower position. In this way, when the next bonding material is applied, the next bonding material does not come into contact with the previously applied bonding material.

In the first embodiment, the two arrangement regions, which are the first arrangement region 1a and the second arrangement region 1b, are set on the front surface of the conductive plate 1. However, the first embodiment is not limited to this example. Three or more arrangement regions having different heights may be set on the front surface of the conductive plate 1, and different kinds of bonding material may be applied to the arrangement regions by using different masks suitable for the respective arrangement regions.

Second Embodiment

Figure 3:
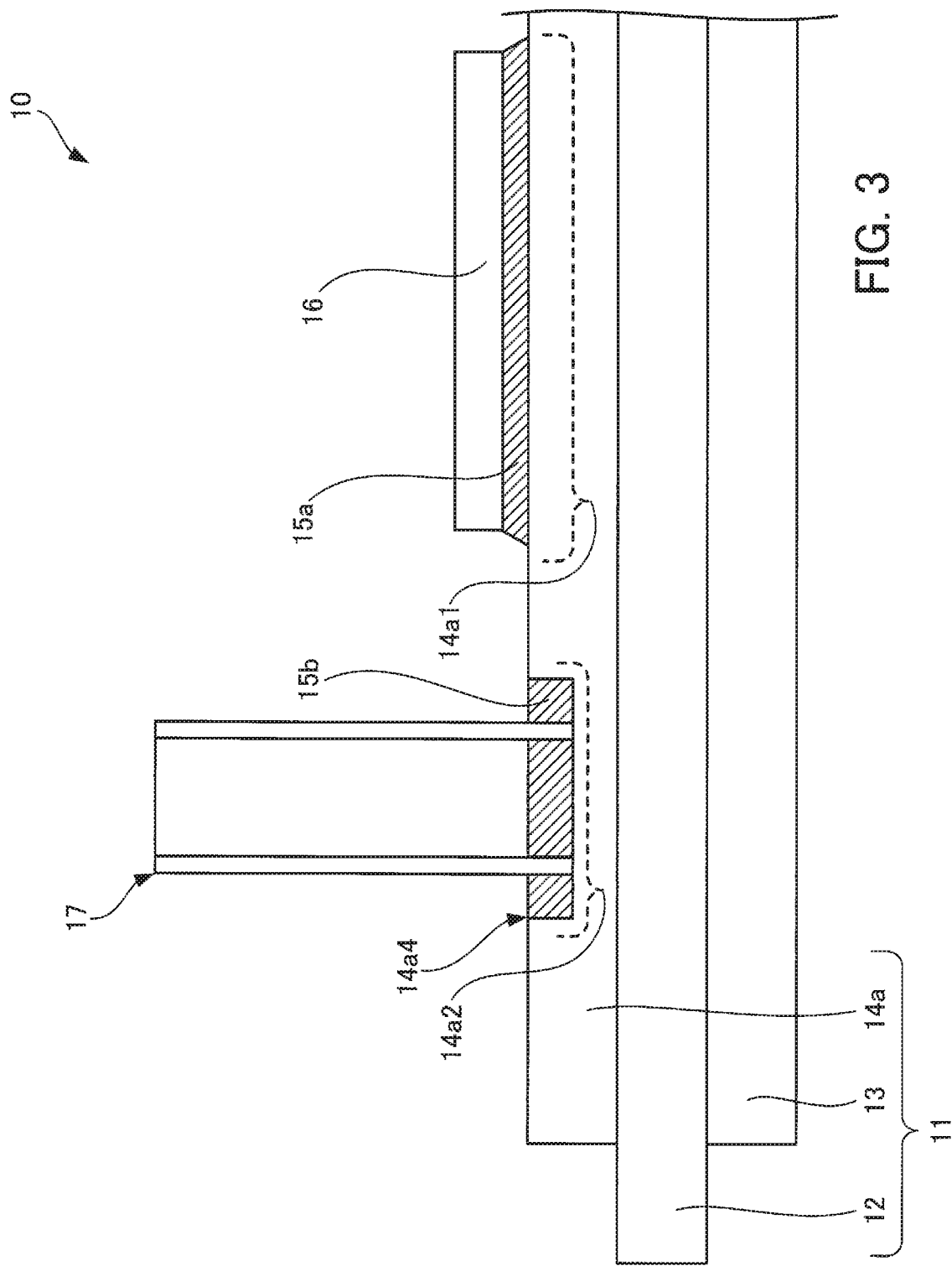
FIG. 3 is a cross section of a main part of a semiconductor device according to a second embodiment.
Figure 4A:
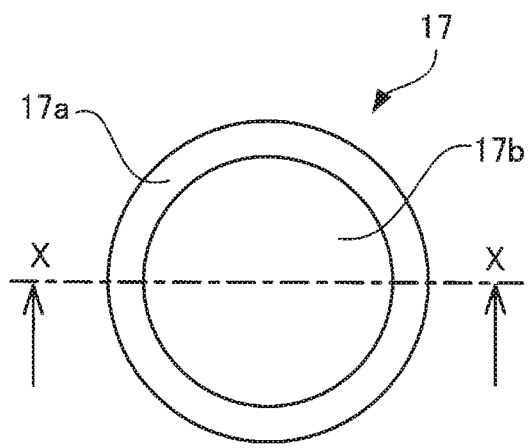
FIGS. 4A and 4B illustrate a contact part of the semiconductor device according to the second embodiment.
Figure 4B:
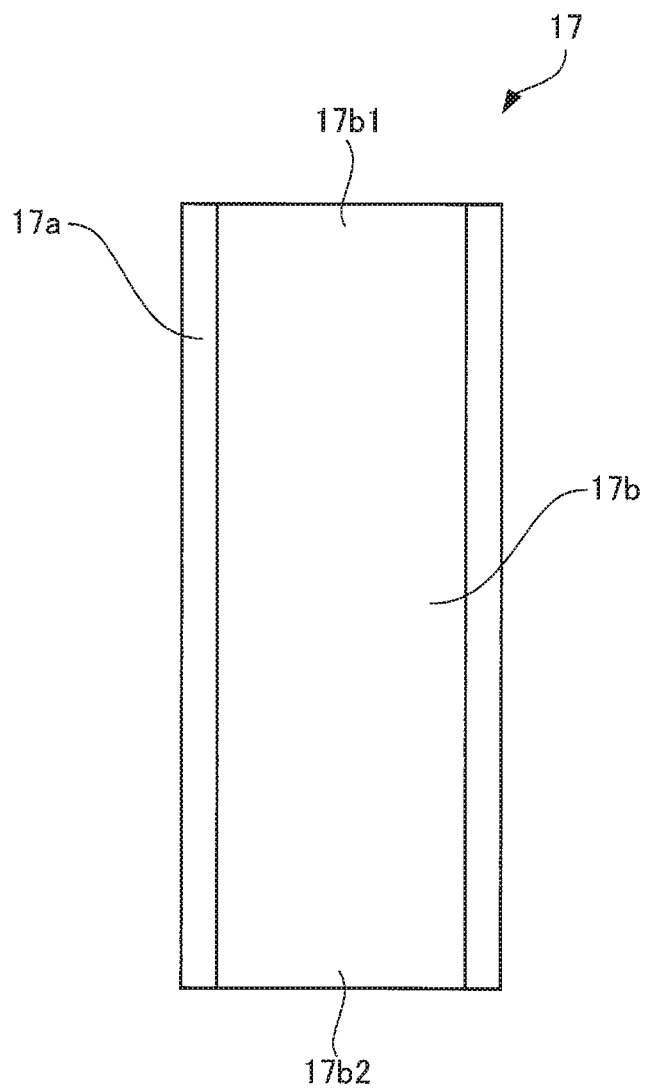

A semiconductor device according to a second embodiment will be described with reference to FIGS. 3, 4A, and 4B. FIG. 3 is a cross section of a main part of the semiconductor device according to the second embodiment. More specifically, FIG. 3 illustrates an enlarged cross section of an end part of a ceramic circuit board 11 included in a semiconductor device 10. FIGS. 4A and 4B illustrate a contact part of the semiconductor device according to the second embodiment. More specifically, FIG. 4A is a top view of a contact part 17, and FIG. 4B is a cross section taken along an alternate long and short dash line X-X in FIG. 4A.

The semiconductor device 10 includes at least the ceramic circuit board 11, a semiconductor chip 16 bonded to a front surface of the ceramic circuit board 11 via solder 15a, and the contact part 17 bonded to the front surface of the ceramic circuit board 11 via solder 15b. While the solder 15a and 15b are initially paste-like solder, the solder 15a and 15b are cured by curing treatment performed when the semiconductor device 10 illustrated in FIG. 3 is manufactured.

In addition, while a plurality of semiconductor chips 16 and contact parts 17 may be arranged on the front surface of the ceramic circuit board 11 as needed, only one semiconductor chip 16 and one contact part 17 are illustrated in FIG. 3. The front surface refers to the surface (the upper side in FIG. 3) on which the semiconductor chip 16 and the contact part 17 of the semiconductor device 10 in FIG. 3 are arranged. In addition, the rear surface refers to the surface (the lower side in FIG. 3) opposite to the side on which the semiconductor chip 16 and the contact part 17 of the semiconductor device 10 are arranged.

The ceramic circuit board 11 includes an insulating plate 12, a metal plate 13 formed on the rear surface of the insulating plate 12, and a circuit pattern 14a formed on a front surface of the insulating plate 12. The circuit pattern 14a is one of the plurality of circuit patterns formed on the insulating plate 12. The insulating plate 12 is made of ceramic material having high thermal conductivity, such as aluminum oxide, aluminum nitride, or silicon nitride having excellent thermal conductivity. The metal plate 13 is made of metal material having excellent thermal conductivity, such as aluminum, iron, silver, copper, or an alloy including at least one kind of these elements. The circuit pattern 14a is made of metal material having excellent electrical conductivity, such as copper or a copper alloy. In addition, for example, metal material such as nickel or gold may be formed on the surface of the metal plate 13 and the circuit pattern 14a by plate processing or the like, to improve their corrosion resistance. Specifically, other than nickel or gold, a nickel-phosphorus alloy, a nickel-boron alloy, or the like may be formed. Gold may additionally be accumulated on a nickel-phosphorus alloy. For example, a direct copper bonding (DCB) substrate or an active metal brazed (AMB) substrate may be used as the ceramic circuit board 11 having this configuration. The ceramic circuit board 11 is able to transfer and release the heat generated by the semiconductor chip 16 to the lower side in FIG. 3 via the circuit pattern 14a, the insulating plate 12, and the metal plate 13. The contact part 17 and the semiconductor chip 16 are electrically connected via the circuit pattern 14a of the ceramic circuit board 11.

In addition, a chip arrangement region 14a1 and a wiring arrangement region 14a2 are set on a front surface of the circuit pattern 14a. The wiring arrangement region 14a2 is formed on the bottom part of a concave part 14a4 and is at a position lower than the chip arrangement region 14a1. The thickness of the circuit pattern 14a is preferably 0.10 mm or more and 5.00 mm or less, more preferably 0.20 mm or more and 2.00 mm or less. The depth of the concave part 14a4 is preferably 0.1 times or more and 0.9 times or less than the thickness of the circuit pattern 14a, more preferably 0.1 times or more and 0.5 times or less than the thickness of the circuit pattern 14a. The width of the concave part 14a4 is preferably 1.05 times or more and 1.50 times or less than the outer diameter of an opening end part 17b2 of the contact part 17, more preferably 1.1 times or more and 1.25 times or less than the outer diameter of the opening end part 17b2 of the contact part 17. By arranging the contact part 17 in the center portion of the wiring arrangement region 14a2 (the concave part 14a4) having the above diameter, the distance between the outer diameter of the opening end part 17b2 of the contact part 17 and the (inner wall of) concave part 14a4 is suitably ensured.

For example, the semiconductor chip 16 includes a switching element such as an IGBT or a power MOSFET. This semiconductor chip 16 includes, for example, a drain electrode (or a collector electrode) as a main electrode on its rear surface and a gate electrode and a source electrode (or an emitter electrode) as main electrodes on its front surface. In addition, the semiconductor chip 16 includes, as needed, a diode such as a Schottky barrier diode (SBD) or a freewheeling diode (FWD). Such a semiconductor chip 16 includes a cathode electrode as a main electrode on its rear surface and an anode electrode as a main electrode on its front surface. The rear surface of the semiconductor chip 16 described above is bonded to the chip arrangement region 14a1 of the circuit pattern 14a via the solder 15a.

As illustrated in FIGS. 4A and 4B, the contact part 17 has a tubular body part 17a including a hallow hole 17b that extends between an opening end part 17b1 and the opening end part 17b2. In FIG. 3, the opening end part 17b2 is bonded to the concave part 14a4 of the circuit pattern 14a by the solder 15b. In addition, a pin-like external connection terminal (not illustrated) is pressed into the opening end part 17b1, which is opposite to the opening end part 17b2 bonded to the circuit pattern 14a. The external connection terminal is made of aluminum, iron, silver, copper, or an alloy including at least one kind of these elements having excellent electrical conductivity. The external connection terminal is a rod-like terminal and has a square cross section, for example. The external connection terminal is pressed into the hallow hole 17b of the contact part 17 and is electrically connected to the circuit pattern 14a via the contact part 17.

This contact part 17 is also made of aluminum, iron, silver, copper, or an alloy including at least one kind of these elements having excellent electrical conductivity. In addition, for example, metal material such as nickel or gold may be formed on the surface of the contact part 17 (the surface of the body part 17a and the surface of the hallow hole 17b) by plate processing or the like, to improve the corrosion resistance of the contact part 17. Specifically, other than nickel or gold, a nickel-phosphorus alloy, a nickel-boron alloy, or the like may be formed. Gold may additionally be accumulated on a nickel-phosphorus alloy. The inner diameter of each of the opening end parts 17b1 and 17b2 of the hallow hole 17b of the contact part 17 is preferably 0.20 mm or more and 2.00 mm or less, more preferably 0.50 mm or more and 1.50 mm or less. The outer diameter of each of the opening end parts 17b1 and 17b2 of the contact part 17 is preferably 1.00 mm or more and 2.50 mm or less, more preferably 1.50 mm or more and 2.00 mm or less. A flange may be formed at at least one of the opening end parts 17b1 and 17b2 of the contact part 17.

As described above, the solder 15a is applied between the semiconductor chip 16 and the chip arrangement region 14a1 of the circuit pattern 14a. When the paste-like solder 15a is cured, the semiconductor chip 16 is bonded to the chip arrangement region 14a1 of the circuit pattern 14a. The cured solder 15a transfers the heat from the semiconductor chip 16 to the circuit pattern 14a. Thus, if the cured solder 15a contains many voids, the thermal conductivity deteriorates. Thus, suitable material is selected for the paste-like solder 15a so that many voids will not be contained in the cured solder 15a. Thus, it is preferable that the paste-like solder 15a contain much flux material, have high wettability, and have a low melting point (liquidus temperature or liquidus line temperature). As the solder 15a, intermediate temperature solder or intermediate-to-high temperature solder whose liquidus temperature is 200° C. or higher and lower than 225° C. is used. For example, intermediate-to-high temperature solder whose liquidus temperature is 219° C., such as tin (Sn)-silver (Ag)-copper (Cu) solder or Sn—Ag—Cu-nickel (Ni)-germanium (Ge) solder is preferable. For example, rosin reducing agent such as abietic acid or solvent such as butyl carbitol is used as the flux material. In addition, acrylic or polyether polymer, thixotropic agent such as triglyceride or fatty acid ester, or activator such as adipic acid or fumaric acid may be included, as needed. It is preferable that the amount of the flux material in this case be 10 wt % or more and 15 wt % or less. Alternatively, it is desirable that intermediate temperature solder whose liquidus temperature is 206° C., such as Sn-indium(In)-Ag-bismuth(Bi) solder, be used as the solder 15a and that the flux material as described above be used. It is preferable that the amount of the flux material in this case be 10 wt % or more and 15 wt % or less.

As described above, the solder 15b is arranged between the contact part 17 and the wiring arrangement region 14a2 of the circuit pattern 14a. When the paste-like solder 15b is cured, the contact part 17 is bonded to the wiring arrangement region 14a2 of the circuit pattern 14a. When bonded to the wiring arrangement region 14a2, the paste-like solder 15b could rise in the hallow hole 17b of the contact part 17. If the solder 15b rises in the hallow hole 17b of the contact part 17, the amount of the solder 15b on the wiring arrangement region 14a2 decreases, and the contact part 17 is not suitably bonded to the wiring arrangement region 14a2 of the circuit pattern 14a. In addition, the external connection terminal could not appropriately be pressed into the contact part 17. In addition, if heavy load is applied to the contact part 17, the contact part 17 could be bent. Thus, to prevent this rising of the solder 15b into the hallow hole 17b of the contact part 17, it is preferable that the paste-like solder 15b not contain much flux material, have low wettability, and have a high melting point (liquidus temperature).

It is preferable that the amount of the flux material of the paste-like solder 15b be less than that of the paste-like solder 15a. For example, when the solder 15a and the solder 15b are the above intermediate-to-high temperature solder having an approximately equal liquidus temperature, it is preferable that the amount of the flux material of the paste-like solder 15b be less than that of the paste-like solder 15a. In this case, it is also preferable that the weight ratio of the flux material of the paste-like solder 15b be lower than that of the paste-like solder 15a. Under this condition, for example, it is preferable that the amount of the flux material be 8 wt % or more and 12 wt % or less.

In addition, it is preferable that the solder 15b have a higher liquidus temperature than that of the solder 15a. For example, when the paste-like solder 15a and the paste-like solder 15b have an approximately equal amount of flux material, the liquidus temperature of the solder 15b is higher than that of the solder 15a. When the solder 15a is intermediate temperature solder whose liquidus temperature is 206° C., such as Sn—In—Ag—Bi solder, intermediate-to-high temperature solder whose liquidus temperature is higher than that of the solder 15a may be used as the solder 15b. For example, intermediate-to-high temperature solder whose liquidus temperature is 219° C., such as Sn—Ag—Cu solder or Sn—Ag—Cu—Ni—Ge solder, may be used as the solder 15b.

Next, a method for applying the paste-like solder 15a and 15b to the ceramic circuit board 11 of the semiconductor device 10 will be described with reference to FIGS. 5A and 5B. More specifically, FIGS. 5A and 5B illustrate a semiconductor device manufacturing method according to the second embodiment. FIGS. 5A and 5B illustrate a case in which the solder 15b and the solder 15a are applied sequentially to the wiring arrangement region 14a2 and the chip arrangement region 14a1 of the circuit pattern 14a, respectively, by metal stencil printing.

First, the ceramic circuit board 11 is prepared. As described above, the chip arrangement region 14a1 and the wiring arrangement region 14a2, which is at a position lower than the chip arrangement region 14a1 and at the bottom part of the concave part 14a4, are set on the circuit pattern 14a of the ceramic circuit board 11.

Next, as illustrated in FIG. 5A, a first mask 51 having a wiring opening 51a corresponding to the wiring arrangement region 14a2 is arranged on the circuit pattern 14a of the ceramic circuit board 11. Consequently, the front surface of the circuit pattern 14a other than the front surface corresponding to the wiring arrangement region 14a2 is masked by the first mask 51. In this state, the paste-like solder 15b is applied to the wiring arrangement region 14a2 on the concave part 14a4 through the wiring opening 51a by sliding a squeegee (not illustrated) on the first mask 51. Next, the first mask 51 is removed. In this way, the solder 15b is applied only to the wiring arrangement region 14a2 of the circuit pattern 14a.

Next, as illustrated in FIG. 5B, a second mask 52 having a chip opening 52a corresponding to the chip arrangement region 14a1 is arranged on the circuit pattern 14a of the ceramic circuit board 11. Consequently, the front surface of the circuit pattern 14a other than the front surface corresponding to the chip arrangement region 14a1 is masked by the second mask 52. In this state, the paste-like solder 15a is applied to the chip arrangement region 14a1 through the chip opening 52a by sliding a squeegee (not illustrated) on the second mask 52. Next, the second mask 52 is removed. In this way, the solder 15a is applied only to the chip arrangement region 14a1 of the circuit pattern 14a. For example, the first mask 51 and the second mask 52 are made of metal material, resin material, etc. and have a thickness of 0.1 mm or more and 0.5 mm or less.

Next, by using a jig, etc., the semiconductor chip and the contact part 17 are arranged on the chip arrangement region 14a1 and the wiring arrangement region 14a2 of the circuit pattern 14a of the ceramic circuit board 11 via the solder 15a and 15b. In this state, by performing solder curing treatment in a reflow oven or the like, the semiconductor device 10 (FIG. 3) in which the semiconductor chip 16 and the contact part 17 are bonded on the chip arrangement region 14a1 and the wiring arrangement region avia the cured solder 15a and 15b is obtained.

As described above, according to the manufacturing method of the semiconductor device 10, the ceramic circuit board 11 including the circuit pattern 14a having the chip arrangement region 14a1 and the wiring arrangement region 14a2 that is lower than the chip arrangement region 14a1 and that is on the concave part 14a4 on the front surface is prepared. Next, by performing metal stencil printing, the paste-like solder 15b is applied to the wiring arrangement region 14a2, and the paste-like solder 15a is applied to the chip arrangement region 14a1. Next, the semiconductor chip is bonded to the chip arrangement region 14a1 via the paste-like solder 15a, and the contact part 17 is bonded to the wiring arrangement region 14a2 via the paste-like solder 15b. In this case, the chip arrangement region 14a1 and the wiring arrangement region 14a2 are set with different heights on the front surface of the circuit pattern 14a. Thus, in the metal stencil printing, by selectively using the first and second masks 51 and 52 depending on the region, the different solder 15a and 15b suitable for the respective semiconductor chip 16 and contact part 17 are applied to the chip arrangement region 14a1 and the wiring arrangement region 14a2. As a result, fewer voids occur in the solder 15a under the semiconductor chip 16, and rising of the solder 15b into the contact part 17 is prevented. Consequently, the semiconductor chip 16 and the contact part 17 are certainly bonded to the chip arrangement region 14a1 and the wiring arrangement region 14a2 of the circuit pattern 14a, and the reliability of the semiconductor device 10 is ensured.

The second embodiment has been described by using an example in which the paste-like solder 15a and 15b having different melting points (liquidus temperatures) or different flux amounts are used. However, the second embodiment is not limited to this example. For example, the paste-like solder 15a and 15b having different flux components may be used.

In addition, the second embodiment has been described by using an example in which the semiconductor chip 16 is arranged with the contact part 17. However, a wiring material other than the contact part 17 may be used. For example, wiring material made of conductive material such as a lead frame or a contact pin may be used.

Third Embodiment

Figure 6:
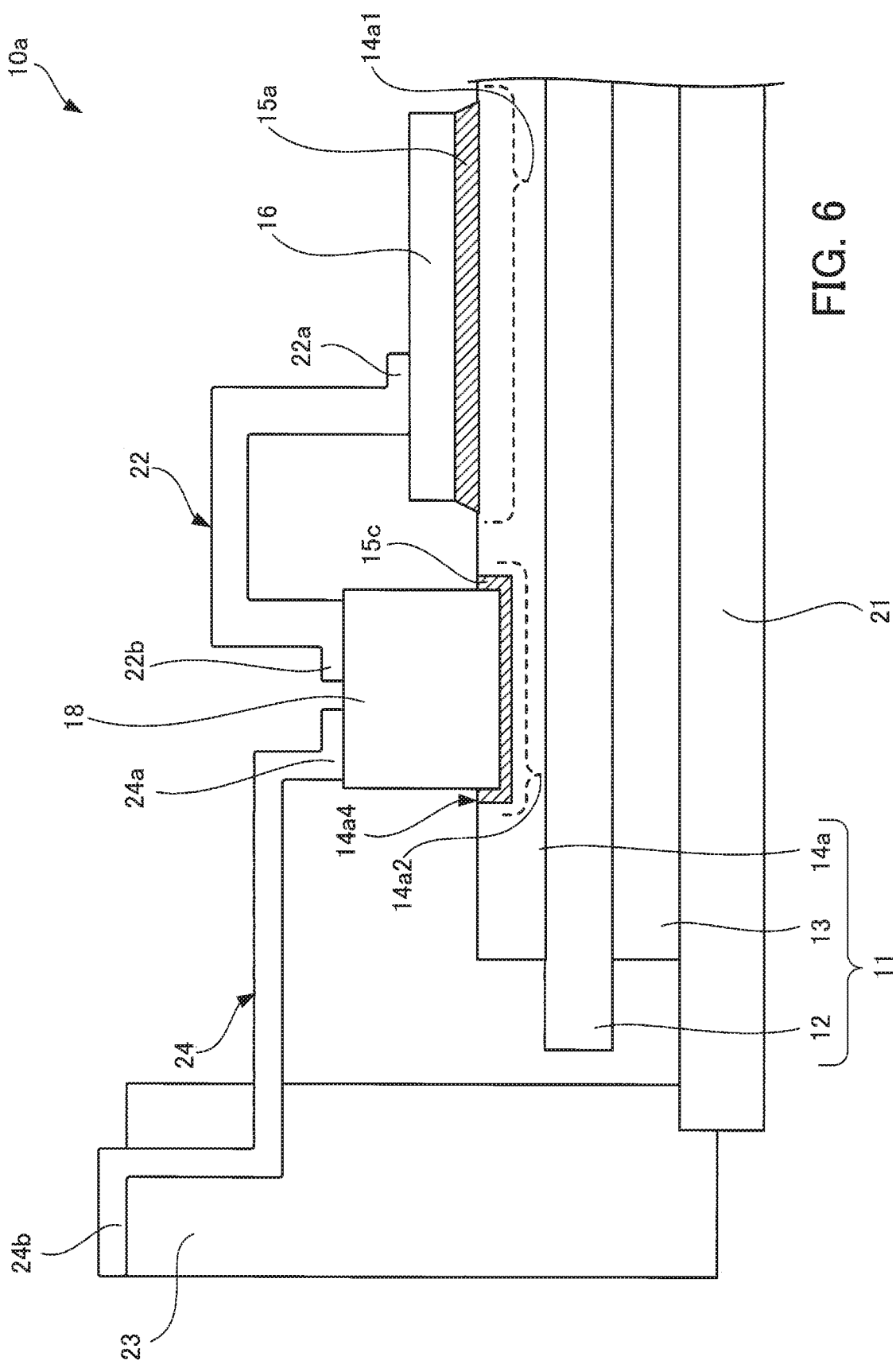
FIG. 6 is a cross section of a main part of a semiconductor device according to a third embodiment.

In a third embodiment, a semiconductor device using a metal block as the wiring material in the second embodiment will be described with reference to FIG. 6. FIG. 6 is a cross section of a main part of the semiconductor device according to the third embodiment. More specifically, FIG. 6 is an enlarged cross section of an end part around a ceramic circuit board 11 included in a semiconductor device 10a. In addition, the elements commonly used in the semiconductor device 10a and the semiconductor device 10 will be denoted by the same reference characters, and detailed description thereof will be omitted or simplified.

The semiconductor device 10a includes at least the ceramic circuit board 11, a semiconductor chip 16 bonded to a front surface of the ceramic circuit board 11 via solder 15a, and a metal block 18 bonded to the front surface of the ceramic circuit board 11 via solder 15c. While the solder 15a and 15c are initially paste-like solder, the solder 15a and 15c are cured by curing treatment performed when the semiconductor device 10a illustrated in FIG. 6 is manufactured. In addition, the semiconductor device 10a includes a heat radiation plate 21 arranged on a rear surface of the ceramic circuit board 11, a lead frame 22 that electrically connects the semiconductor chip 16 and the metal block 18, a case 23 that surrounds the ceramic circuit board 11, etc., and an external connection terminal 24 electrically connected to the metal block 18.

The metal block 18 has a cuboid or cubic shape and is made of aluminum, iron, silver, copper, or an alloy containing at least one kind of these elements having excellent electrical conductivity. In addition, for example, metal material such as nickel or gold may be formed on the surface of the metal block 18 by plate processing or the like, to improve the corrosion resistance of the metal block 18. Specifically, other than nickel or gold, a nickel-phosphorus alloy, a nickel-boron alloy, or the like may be formed. Gold may additionally be accumulated on a nickel-phosphorus alloy.

For example, the heat radiation plate 21 is made of aluminum, iron, silver, copper, or an alloy containing at least one kind of these elements having excellent thermal conductivity. In addition, for example, material such as nickel may be formed on the surface of the heat radiation plate 21 by plate processing or the like, to improve the corrosion resistance of the heat radiation plate 21. Specifically, other than nickel, a nickel-phosphorus alloy, a nickel-boron alloy, or the like may be formed.

The heat radiation performance may be improved by attaching a cooler (not illustrated) to the rear surface of the heat radiation plate 21 via solder, silver solder, or the like. In this case, the cooler is made of, for example, aluminum, iron, silver, copper, or an alloy containing at least one kind of these elements having excellent thermal conductivity. In addition, a heatsink, a water-cooling cooling device, or the like including a fin or a plurality of fins may be used as the cooler. In addition, the heat radiation plate 21 may be formed integrally with the cooler. In this case, the heat radiation plate 21 is made of aluminum, iron, silver, copper, or an alloy containing at least one kind of these elements having excellent thermal conductivity. In addition, for example, material such as nickel may be formed on the surface of the heat radiation plate 21 integrally formed with the cooler by plate processing or the like, to improve the corrosion resistance of the heat radiation plate 21. Specifically, other than nickel, a nickel-phosphorus alloy, a nickel-boron alloy, or the like may be formed.

The lead frame 22 is made of aluminum, iron, silver, copper, or an alloy containing at least one kind of these elements having excellent electrical conductivity. In addition, for example, metal material such as nickel or gold may be formed on the surface of the lead frame 22 by plate processing or the like, to improve the corrosion resistance of the lead frame 22. Specifically, other than nickel or gold, a nickel-phosphorus alloy, a nickel-boron alloy, or the like may be formed. Gold may additionally be accumulated on a nickel-phosphorus alloy. The lead frame 22 has a connection part 22a on one end thereof, and this connection part 22a is electrically and mechanically connected to a main electrode of the semiconductor chip 16 via solder or the like (not illustrated). The lead frame 22 has a connection part 22b on the other end thereof, and this connection part 22b is electrically and mechanically connected to a front surface of the metal block 18 by laser bonding or the like. Consequently, the semiconductor chip 16 and the metal block are electrically connected to each other via the lead frame 22.

The case 23 is, for example, a box-like case and is made of thermoplastic resin. Examples of the resin include polyphenylenesulfide (PPS), polybutyleneterephthalate (PBT) resin, polybutylene succinate (PBS) resin, polyamide (PA) resin, and acrylonitrile butadiene styrene (ABS) resin. In addition, the case 23 is formed integrally with the external connection terminal 24 made of electrical conductive material. The case 23 is bonded to the heat radiation plate 21 by adhesive agent, and an internal connection part 24a at one end of the external connection terminal 24 is electrically and mechanically connected to the front surface of the metal block 18 by laser bonding or the like. Consequently, an external connection part 24b at the other end of the external connection terminal 24 and the semiconductor chip 16 are electrically connected to each other via the lead frame 22, the metal block 18, and the external connection terminal 24.

In addition, the inside of the case 23 of the semiconductor device 10a may be sealed by sealing material (not illustrated). The sealing material is made of, for example, thermoset resin such as maleimide-modified epoxy resin, maleimide-modified phenolic resin, or maleimide resin. The sealing material may alternatively be made of gel such as silicone resin. The sealing material is injected into the case 23 via a predetermined inlet formed therein, and the ceramic circuit board 11, the semiconductor chip 16, the metal block 18, etc. are sealed on the heat radiation plate 21.

It is also preferable that the paste-like solder 15a arranged between the semiconductor chip 16 and the chip arrangement region 14a1 of the circuit pattern 14a of the semiconductor device 10a not contain many voids when cured. Thus, as in the second embodiment, it is preferable that the paste-like solder 15a contain much flux material, have high wettability, and have a low melting point (liquidus temperature). As the solder 15a, an intermediate-to-high temperature solder whose liquidus line temperature is 200° C. or higher and lower than 225° C. is used. For example, it is preferable that intermediate-to-high temperature solder whose liquidus temperature is 219° C., such as tin (Sn)-silver (Ag)-copper (Cu) solder or Sn—Ag—Cu-nickel (Ni)-germanium (Ge) solder, be used as the solder 15a. For example, rosin reducing agent such as abietic acid or solvent such as butyl carbitol is used as the flux material. In addition, acrylic or polyether polymer, thixotropic agent such as triglyceride or fatty acid ester, or activator such as adipic acid or fumaric acid may be included, as needed. It is preferable that the amount of the flux material in this case be 10 wt % or more and 15 wt % or less.

As described above, the solder 15c is arranged between the metal block 18 and the wiring arrangement region 14a2 of the circuit pattern 14a. Next, when the paste-like solder 15c is cured, the metal block 18 and the wiring arrangement region 14a2 of the circuit pattern 14a are bonded to each other. When the lead frame 22 and the external connection terminal 24 are electrically connected, the metal block 18 generates heat. It is desirable that this heat generated by the metal block 18 be suitably transferred to the back side of the ceramic circuit board 11. Thus, if the cured solder 15c includes many voids, the thermal conductivity deteriorates. Thus, suitable material is selected for the paste-like solder 15c so that many voids will not be contained in the cured solder 15c. Thus, as is the case with the solder 15a, it is preferable that the paste-like solder 15c contain much flux material and have high wettability. In addition, the metal block 18 has larger heat capacity than other parts bonded such as the semiconductor chip 16. Thus, in the solder curing step, the bonded part of the metal block 18 is not heated as quickly as the other bonded parts such as the semiconductor chip. Thus, it is preferable that the melting point (liquidus temperature) of the solder 15c be lower than that of the solder 15a. Low temperature solder or intermediate-to-low temperature solder whose liquidus temperature is lower than 200° C. is used as the solder 15c. For example, it is preferable that low temperature solder whose liquidus temperature is 139° C. such as Bi-Sn solder or intermediate-to-low temperature solder whose liquidus temperature is 196° C. such as Sn-zinc (Zn)-Bi solder be used. For example, rosin reducing agent such as abietic acid or solvent such as butyl carbitol is used as the flux material. In addition, acrylic or polyether polymer, thixotropic agent such as triglyceride or fatty acid ester, or activator such as adipic acid or fumaric acid may be included, as needed. As is the case with the solder 15a, it is preferable that the amount of the flux material in this case be 10 wt % or more and 15 wt % or less.

As in the second embodiment, in the case of the semiconductor device 10a having the above configuration, the solder 15a and the solder 15c are applied to the chip arrangement region 14a1 and the wiring arrangement region 14a2 of the circuit pattern 14a by metal stencil printing using the first mask 51 and the second mask 52.

As a result, fewer voids occur in the solder 15a under the semiconductor chip 16 and in the solder 15c under the metal block 18. Consequently, the semiconductor chip 16 and the metal block 18 are certainly bonded to the chip arrangement region 14a1 and the wiring arrangement region 14a2 of the circuit pattern 14a, and the reliability of the semiconductor device 10a is ensured.

The third embodiment has been described by using an example in which the metal block 18 electrically connected to the lead frame 22 and the external connection terminal 24 is arranged. However, alternatively, a metal block 18 formed by a heatsink or the like that is not electrically connected may be used in place of the above metal block 18.

Fourth Embodiment

Figure 7:
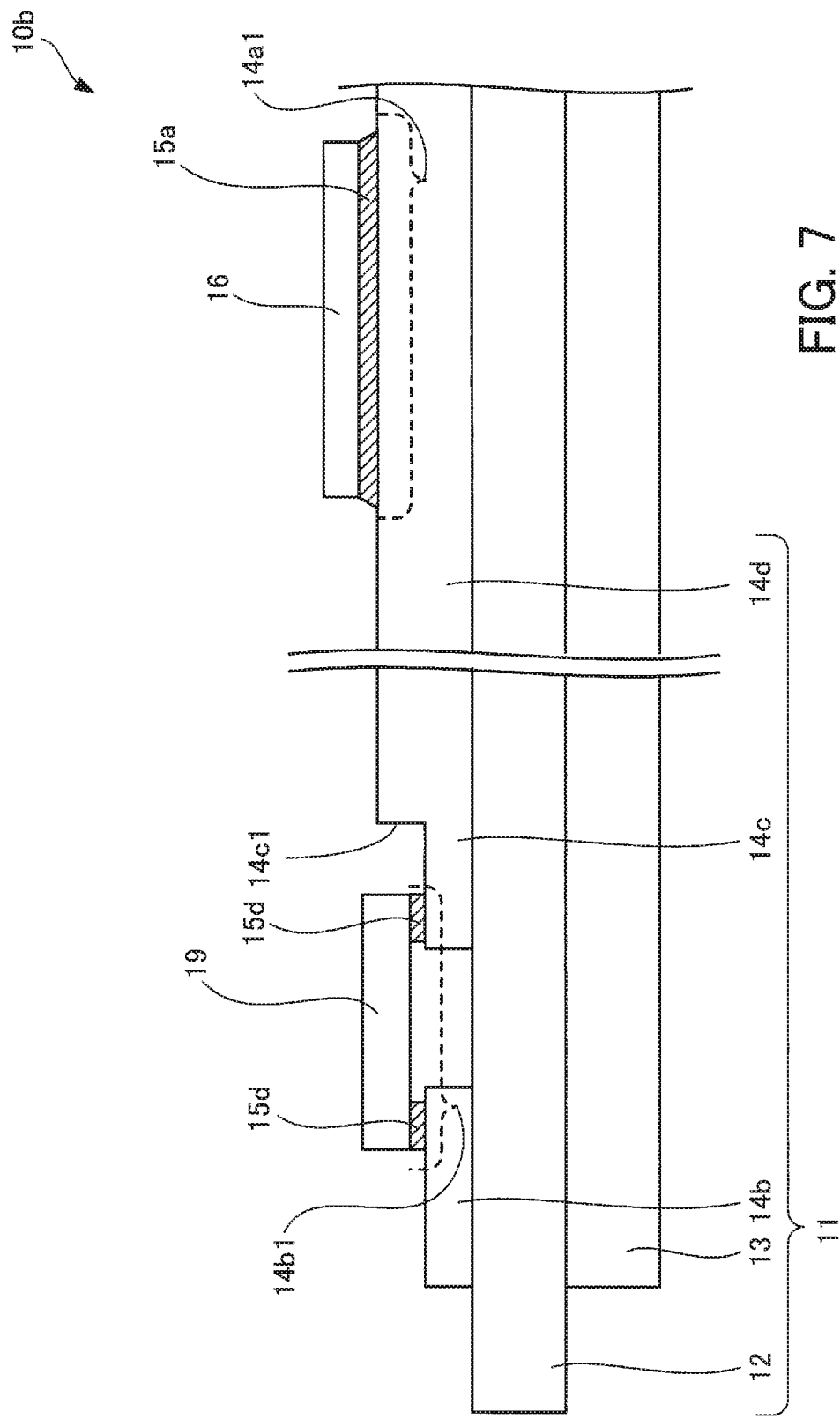
FIG. 7 is a cross section of a main part of a semiconductor device according to a fourth embodiment.

In a fourth embodiment, a semiconductor device using an electronic part in place of the wiring member in the second embodiment will be described with reference to FIG. 7. FIG. 7 is a cross section of a main part of a semiconductor device according to the fourth embodiment. More specifically, FIG. 7 is an enlarged cross section of an end part around a ceramic circuit board 11 included in a semiconductor device 10b. In addition, the elements commonly used in the semiconductor device 10b, 10, and 10a will be denoted by the same reference characters, and detailed description thereof will be omitted or simplified.

The semiconductor device 10b includes at least the ceramic circuit board 11, a semiconductor chip 16 bonded to a front surface of the ceramic circuit board 11 via solder 15a, and an electronic part 19 bonded to the front surface of the ceramic circuit board 11 via solder 15d. While the solder 15a and 15d are initially paste-like solder, the solder 15a and 15d are cured by curing treatment performed when the semiconductor device 10b illustrated in FIG. 7 is manufactured.

Circuit patterns 14b to 14d are formed on an insulating plate 12 of the ceramic circuit board 11 according to the fourth embodiment. The circuit patterns 14b and 14c are formed on a front surface of the insulating plate 12 with a predetermined gap therebetween. The border of the circuit patterns 14c and 14d is not illustrated in FIG. 7. The circuit pattern 14c has a step 14c1. The height of a front surface of the circuit pattern 14c on the right side of the step 14c1 in FIG. 7 is the same as that of a front surface of the circuit pattern 14d. The height of the front surface of the circuit pattern 14c on the left side of the step 14c1 in FIG. 7 is the same as that of a front surface of the circuit pattern 14b. In addition, a part arrangement region 14b1 is set on the front surface of the circuit patterns 14b and 14c. The part arrangement region 14b1 extends over the gap between the circuit patterns 14b and 14c. A chip arrangement region 14a1 is set at a position higher than the part arrangement region 14b1 on the front surface of the circuit pattern 14d.

The electronic part 19 is, for example, a control integrated circuit (IC), a thermistor, a capacitor, a resistor, or the like. This electronic part 19 is arranged on the circuit patterns 14b and 14c via the solder 15d.

As in the second embodiment, as the solder 15a arranged between the semiconductor chip 16 and the chip arrangement region 14a1 of the circuit pattern 14d of the semiconductor device 10b, an intermediate-to-high temperature solder whose liquidus temperature is 200° C. or higher and lower than 225° C. is used. For example, it is preferable that intermediate-to-high temperature solder whose liquidus temperature is 219° C. such as tin (Sn)-silver (Ag)-copper (Cu) solder or Sn—Ag—Cu-nickel (Ni)-germanium (Ge) solder be used as the solder 15a. For example, rosin reducing agent such as abietic acid or solvent such as butyl carbitol is used as the flux material. In addition, acrylic or polyether polymer, thixotropic agent such as triglyceride or fatty acid ester, or activator such as adipic acid or fumaric acid may be included, as needed. It is preferable that the amount of the flux material in this case be 10 wt % or more and 15 wt % or less.

As described above, the solder 15d is arranged between the electronic part 19 and the part arrangement region 14b1 of the circuit patterns 14b and 14c. Next, when the paste-like solder 15d is cured, the electronic part 19 and the part arrangement region 14b1 of the circuit patterns 14b and 14c are bonded to each other. When the solder 15d is bonded, if the solder 15d connects the circuit patterns 14b and 14c in a bridge shape over the gap, the circuit patterns 14b and 14c are short-circuited. The individual bonded parts of the part arrangement region 14b1 are much smaller than the bonded part of the chip arrangement region 14a1. Thus, since defective bonding easily occurs, bonding needs to be done certainly with a small amount of solder 15d. Thus, it is preferable that the paste-like solder 15d contain less flux material than that of the paste-like solder 15a and have suitable wettability, and have a low melting point (liquidus temperature). As this solder 15d, low temperature solder or intermediate-to-low temperature solder whose liquidus temperature is lower than 200° C. is used. For example, it is desirable that intermediate-to-low temperature solder whose liquidus temperature is 196° C. such as Sn—Zn—Bi solder or low temperature solder whose liquidus temperature is 139° C. such as Bi—Sn solder be used as the solder 15d. For example, rosin reducing agent such as abietic acid or solvent such as butyl carbitol is used as the flux material. In addition, acrylic or polyether polymer, thixotropic agent such as triglyceride or fatty acid ester, or activator such as adipic acid or fumaric acid may be included, as needed. It is preferable that the amount of flux material of the paste-like solder 15d in this case be less than that of the paste-like solder 15a. In this case, it is also preferable that the weight ratio of the flux material of the paste-like solder 15d be lower than that of the paste-like solder 15a. Under this condition, for example, it is preferable that the amount of flux material be 8 wt % or more and 12 wt % or less.

Next, a method for applying the paste-like solder 15a and 15d to the ceramic circuit board 11 of the semiconductor device 10b will be described with reference to FIGS. 8A and 8B. FIGS. 8A and 8B illustrate a semiconductor device manufacturing method according to the fourth embodiment. More specifically, FIGS. 8A and 8B illustrate a case in which the solder 15d and 15a are applied sequentially to the part arrangement region 14b1 and the chip arrangement region 14a1 of the circuit patterns 14b to 14d by metal stencil printing.

First, the ceramic circuit board 11 is prepared. As described above, the part arrangement region 14b1 is set on the circuit patterns 14b and 14c of the ceramic circuit board 11, and the chip arrangement region 14a1 is set on the circuit pattern 14d of the ceramic circuit board 11. The part arrangement region 14b1 is set at a position lower than the chip arrangement region 14a1.

Next, as illustrated in FIG. 8A, a third mask 53 having a part opening 53a corresponding to the part arrangement region 14b1 is arranged on the circuit patterns 14b to 14d of the ceramic circuit board 11. Consequently, the front surfaces of the circuit patterns 14b to 14d other than the front surface corresponding to the part arrangement region 14b1 are masked by the third mask 53. In this state, the paste-like solder 15d is applied to the part arrangement region 14b1 through the part opening 53a by sliding a squeegee (not illustrated) on the third mask 53. In this application, by adjusting the material and tension of the third mask 53 and the pressing force of the squeegee to the mask surface, it is possible to apply the paste-like solder 15d while warping the third mask 53 with respect to the part arrangement region 14b1. Next, the third mask 53 is removed. As a result, the solder 15d is applied only to the part arrangement region 14b1 of the circuit patterns 14b and 14c.

Next, as illustrated in FIG. 8B, a fourth mask 54 having a chip opening 54a corresponding to the chip arrangement region 14a1 is arranged on the circuit patterns 14b to 14d of the ceramic circuit board 11. Consequently, the front surfaces of the circuit patterns 14b to 14d other than the front surface corresponding to the chip arrangement region 14a1 are masked by the fourth mask 54. In this state, the paste-like solder 15a is applied to the chip arrangement region 14a1 through the chip opening 54a by sliding a squeegee (not illustrated) on the fourth mask 54. Next, the fourth mask 54 is removed. Consequently, the solder 15a is applied only to the chip arrangement region 14a1 of the circuit pattern 14d. By adjusting the material and tension of the fourth mask 54 and the pressing force of the squeegee to the mask surface, it is possible to apply the paste-like solder 15a while maintaining a gap from the part arrangement region 14b1 to which the solder 15d has previously been applied. In this way, the solder 15d is maintained without being brought into contact with the rear surface of the fourth mask 54. The fourth mask 54 may include a leg part 54b corresponding to the step 14c1 when the fourth mask 54 is arranged on the circuit patterns 14b to 14d.

Next, by using a jig, etc., the semiconductor chip and the electronic part 19 are arranged on the chip arrangement region 14a1 and part arrangement region 14b1 of the circuit patterns 14b to 14d of the ceramic circuit board 11 via the solder 15a and 15d. In this state, by performing solder curing treatment in a reflow oven or the like, the semiconductor device 10b (FIG. 7) in which the semiconductor chip 16 and the electronic part 19 are bonded on the chip arrangement region 14a1 and the part arrangement region 14b1 of the circuit patterns 14b to 14d of the ceramic circuit board 11 via the cured solder 15a and 15d is obtained.

Consequently, fewer voids occur in the solder 15a under the semiconductor chip 16, and disconnection of the solder 15d under the electronic part 19 at the minute bonded parts is prevented. In addition, occurrence of short-circuiting by a solder bridge is prevented. Thus, the semiconductor chip 16 and the electronic part 19 are certainly bonded to the chip arrangement region 14a1 and the part arrangement region 14b1 of the circuit patterns 14b to 14d, and the reliability of the semiconductor device 10b is ensured.

Fifth Embodiment

Figure 9:
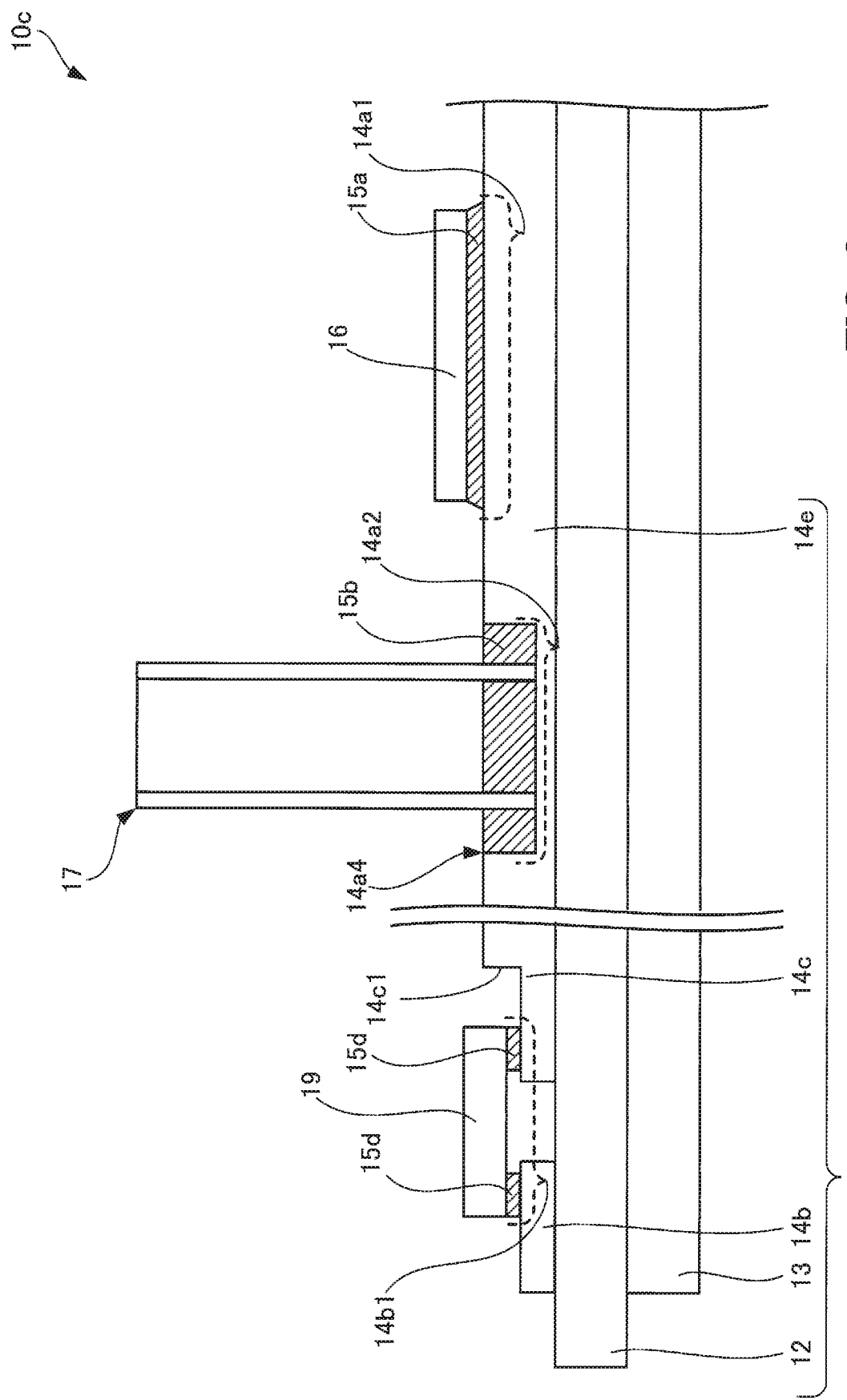
FIG. 9 is a cross section of a main part of a semiconductor device according to a fifth embodiment.

In a fifth embodiment, a semiconductor device including a semiconductor chip, a contact part, and an electronic part on a ceramic circuit board 11 will be described with reference to FIG. 9. FIG. 9 is a cross section of a main part of a semiconductor device according to the fifth embodiment. More specifically, FIG. 9 is an enlarged cross section of an end part around the ceramic circuit board 11 included in a semiconductor device 10c illustrated in FIG. 9. In addition, the elements commonly used in the semiconductor devices 10c, 10, 10a, and 10b will be denoted by the same reference characters, and detailed description thereof will be omitted or simplified.

The semiconductor device 10c includes at least the ceramic circuit board 11 and a semiconductor chip 16, a contact part 17, and an electronic part 19 bonded to a front surface of the ceramic circuit board 11 via solder 15a, 15b, and 15d. While the solder 15a, 15b, and 15d is initially paste-like solder, the solder 15a, 15b, and 15d is cured by curing treatment performed when the semiconductor device 10c illustrated in FIG. 9 is manufactured.

Circuit patterns 14b, 14c, and 14e are arranged on an insulating plate 12 of the ceramic circuit board 11 according to the fifth embodiment. The circuit patterns 14b and 14c are formed on a front surface of the insulating plate 12 with a predetermined gap therebetween. The border of the circuit patterns 14c and 14e is not illustrated in FIG. 9. The circuit pattern 14c has a step 14c1. The height of a front surface of the circuit pattern 14c on the right side of the step 14c1 in FIG. 9 is the same as that of a front surface of the circuit pattern 14e. The height of the front surface of the circuit pattern 14c on the left side of the step 14c1 in FIG. 9 is the same as a front surface of the circuit pattern 14b. A part arrangement region 14b1 that extends over the gap between the circuit patterns 14b and 14c is set on the front surface of the circuit patterns 14b and 14c. A chip arrangement region 14a1 is set at a position higher than the part arrangement region 14b1 on the front surface of the circuit pattern 14e. In addition, the front surface of the circuit pattern 14e has a concave part 14a4, and a wiring arrangement region 14a2 is set at a position lower than the chip arrangement region 14a1 and the part arrangement region 14b1.

As the solder 15a arranged between the semiconductor chip 16 and the chip arrangement region 14a1 of the circuit pattern 14e of the semiconductor device 10c, intermediate-to-high temperature solder whose liquidus temperature is 200° C. or higher and lower than 225° C. is used.

For example, it is preferable that intermediate-to-high temperature solder whose liquidus temperature is 219° C. such as tin (Sn)-silver (Ag)-copper (Cu) solder or Sn—Ag—Cu-nickel (Ni)-germanium (Ge) solder be used as the solder 15a. For example, rosin reducing agent such as abietic acid or solvent such as butyl carbitol is used as the flux material. In addition, acrylic or polyether polymer, thixotropic agent such as triglyceride or fatty acid ester, or activator such as adipic acid or fumaric acid may be included, as needed. It is preferable that the amount of the flux material in this case be 10 wt % or more and 15 wt % or less.

As described above, the solder 15b is arranged between the contact part 17 and the wiring arrangement region 14a2 of the circuit pattern 14e. As in the second embodiment, it is preferable that suitable material be selected for the paste-like solder 15b in this case so that the paste-like solder 15b will not rise into a hallow hole 17b of the contact part 17. In this case, it is preferable that the paste-like solder 15b contain less flux material, have lower wettability, and a higher melting point (liquidus temperature) than those of the paste-like solder 15a. High temperature solder whose liquidus temperature is 225° C. or higher is used as the solder 15b. For example, it is preferable that high temperature solder whose liquidus temperature is 241° C. such as Sn-antimony (Sb) solder be used as the solder 15b. For example, rosin reducing agent such as abietic acid or solvent such as butyl carbitol is used as the flux material. In addition, acrylic or polyether polymer, thixotropic agent such as triglyceride or fatty acid ester, or activator such as adipic acid or fumaric acid may be included, as needed. It is preferable that the weight ratio of the flux material of the paste-like solder 15b in this case be less than that of the paste-like solder 15a. Under this condition, for example, it is preferable that the amount of the flux material be 8 wt % or more and 12 wt % or less.

In addition, as described above, the solder 15d is arranged between the electronic part 19 and the part arrangement region 14b1 of the circuit patterns 14b and 14c. As in the fourth embodiment, it is preferable that the paste-like solder 15d contain less flux material than that of the paste-like solder 15a, have suitable wettability, and have a low melting point (liquidus temperature). Intermediate temperature solder or intermediate-to-low temperature solder whose liquidus temperature is lower than that of the solder 15a is used as this solder 15d. For example, it is desirable that intermediate temperature solder whose liquidus temperature is 196° C. such as Sn-Zn-Bi solder be used as the solder 15d. For example, rosin reducing agent such as abietic acid or solvent such as butyl carbitol is used as the flux material. In addition, acrylic or polyether polymer, thixotropic agent such as triglyceride or fatty acid ester, or activator such as adipic acid or fumaric acid may be included, as needed. It is preferable that the weight ratio of the flux material in this case be less than that of the paste-like solder 15a. Under this condition, it is preferable that the amount of the flux material be 8 wt % or more and 12 wt % or less, for example.

Figure 11:
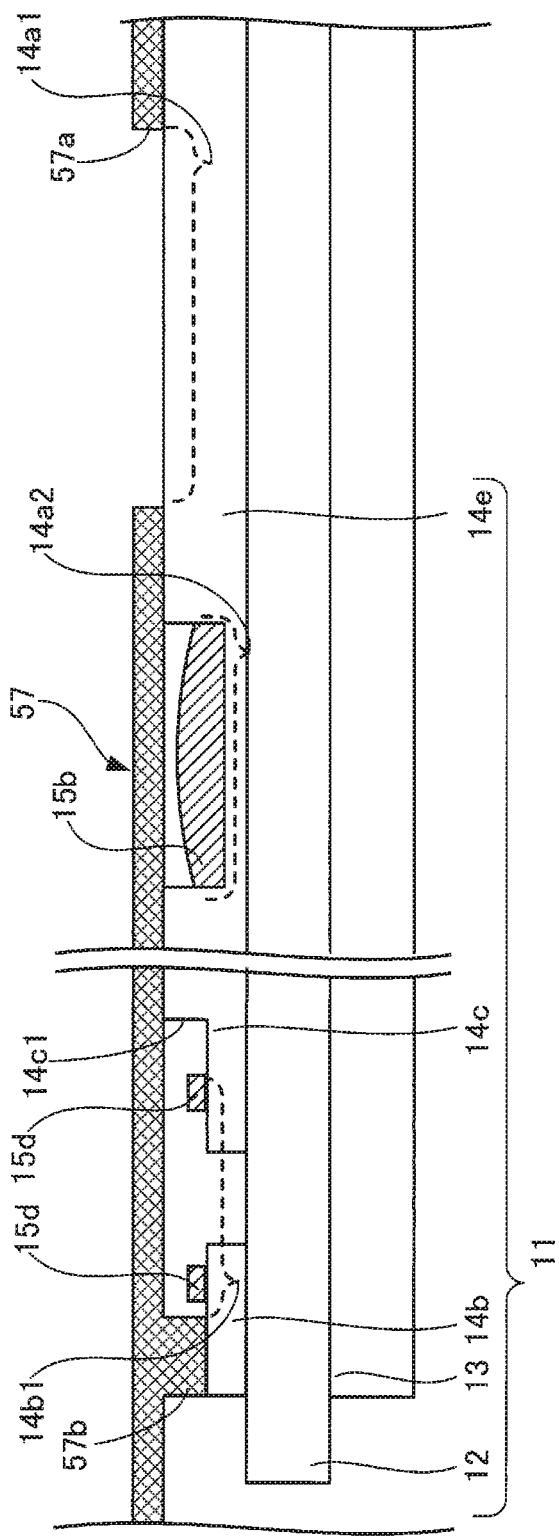
FIG. 11 illustrates the semiconductor device manufacturing method according to the fifth embodiment.

Next, a method for applying the paste-like solder 15a, 15b, and 15d to the ceramic circuit board 11 of the semiconductor device 10c will be described with reference to FIGS. 10A, 10B, and 11. More specifically, FIGS. 10A, 10B, and 11 illustrate a semiconductor device manufacturing method according to the fifth embodiment. FIGS. 10A, 10B, and 11 illustrate a case in which the solder 15d, 15b, and 15a are applied sequentially to the part arrangement region 14b1, the wiring arrangement region 14a2, and the chip arrangement region 14a1 of the circuit patterns 14b, 14c, and 14e by metal stencil printing.

First, the ceramic circuit board 11 is prepared. As described above, the part arrangement region 14b1, the wiring arrangement region 14a2, and the chip arrangement region 14a1 are set on the circuit patterns 14b, 14c, and 14e of the ceramic circuit board 11. In addition, the circuit pattern 14e has the concave part 14a4, and the wiring arrangement region 14a2 is set at a position lower than the part arrangement region 14b1 and the chip arrangement region 14a1.

Next, as illustrated in FIG. 10A, a fifth mask 55 having a wiring opening 55a corresponding to the wiring arrangement region 14a2 is arranged on the circuit patterns 14b, 14c, and 14e of the ceramic circuit board 11. Consequently, the front surfaces of the circuit patterns 14b, 14c, and 14e other than the front surface corresponding to the wiring arrangement region 14a2 are masked by the fifth mask 55. In this state, the paste-like solder 15b is applied to the wiring arrangement region 14a2 on the concave part 14a4 through the wiring opening 55a by sliding a squeegee (not illustrated) on the fifth mask 55. Next, the fifth mask 55 is removed. In this way, the solder 15b is applied only to the wiring arrangement region 14a2 of the circuit pattern 14e.

The fifth mask 55 may be leveled on the circuit patterns 14b, 14c, and 14e when arranged on the circuit patterns 14b, 14c, and 14e.

Next, as illustrated in FIG. 10B, a sixth mask 56 having a part opening 56a corresponding to the part arrangement region 14b1 is arranged on the circuit patterns 14b, 14c, and 14e of the ceramic circuit board 11.

Consequently, the front surfaces of the circuit patterns 14b, 14c, and 14e other than the front surface corresponding to the part arrangement region 14b1 are masked by the sixth mask 56. In this state, the paste-like solder 15d applied to the part arrangement region 14b1 through the part opening 56a by sliding a squeegee (not illustrated) on the sixth mask 56. Next, the sixth mask 56 is removed. In this way, the solder 15d is applied only to the part arrangement region 14b1 of the circuit patterns 14b and 14c.

Next, the sixth mask 56 is removed, and as illustrated in FIG. 11, a seventh mask 57 having a chip opening 57a corresponding to the chip arrangement region 14a1 is arranged on the circuit patterns 14b, 14c, and 14e of the ceramic circuit board 11. Consequently, the front surfaces of the circuit patterns 14b, 14c, and 14e other than the front surface corresponding to the chip arrangement region 14a1 are masked by the seventh mask 57. In this state, the paste-like solder 15a is applied to the chip arrangement region 14a1 through the chip opening 57a by sliding a squeegee (not illustrated) on the seventh mask 57. Next, the seventh mask 57 is removed. In this way, the solder 15a is applied only to the chip arrangement region 14a1 of the circuit pattern 14e. By adjusting the material and tension of the sixth and seventh masks 56 and 57 and the pressing force of the squeegee to the mask surface, it is possible to apply the paste-like solder 15a and 15d to the respective arrangement regions while maintaining a gap from the wiring arrangement region 14a2 on which the solder 15b has previously been applied. In this way, it is possible to maintain the previously applied solder while preventing the sixth and seventh masks 56 and 57 from coming into contact with the previously applied solder. The seventh mask 57 may have a leg part 57b corresponding to the step 14c1 when the seventh mask 57 is arranged on the circuit patterns 14b, 14c, and 14e. This leg part 57b makes it easier to maintain the distance between the seventh mask 57 and the solder 15d.

Next, by using a jig, etc., the semiconductor chip 16, the contact part 17, and the electronic part 19 are arranged on the chip arrangement region 14a1, the wiring arrangement region 14a2, and the part arrangement region 14b1 of the circuit patterns 14b, 14c, and 14e of the ceramic circuit board 11 via the solder 15a, 15b, and 15d. In this state, solder curing treatment is performed by using a reflow oven or the like. As a result, the semiconductor device 10c (FIG. 9) in which the semiconductor chip 16, the contact part 17, and the electronic part 19 are bonded to the chip arrangement region 14a1, the wiring arrangement region 14a2, and the part arrangement region 14b1 of the circuit patterns 14b, 14c, and 14e of the ceramic circuit board 11 via the cured solder 15a, 15b, and 15d is obtained.

Consequently, fewer voids occur in the solder 15a under the semiconductor chip 16, and rising of the solder 15b into the contact part 17 is prevented. In addition, occurrence of short-circuiting by the solder 15d under the electronic part 19 is prevented. Thus, the semiconductor chip 16, the contact part 17, and the electronic part 19 are certainly bonded to the chip arrangement region 14a1, the wiring arrangement region 14a2, and the part arrangement region 14b1 of the circuit patterns 14b, 14c, and 14e, and the reliability of the semiconductor device 10c is ensured.

The semiconductor chip 16, the contact part 17, and the electronic part 19 according to the fifth embodiment are only examples. Any combination of these elements may be used as needed. The number of elements of any kind may also be determined as needed. Even in such cases, the individual arrangement regions have different heights, which are set depending on the kinds of the parts used or the number of parts combined.

According to the embodiments discussed, a plurality of parts of different kinds are suitably bonded onto a conductive plate, and the reliability of a semiconductor device is ensured.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device manufacturing method, comprising:

preparing a conductive plate having a front surface at a front side and a rear surface at a rear side opposite to the front side, the front surface including a first front surface on which a first arrangement region is disposed and a second front surface on which a second arrangement region is disposed, the first front surface having a height measured from the rear surface that is lower than a height of the second front surface measured from the rear surface;

applying an uncured first bonding material to the first arrangement region and an uncured second bonding material different from the uncured first bonding material to the second arrangement region;

disposing a first part on the first arrangement region via the uncured first bonding material and a second part on the second arrangement region via the uncured second bonding material; and bonding, by heating to cure the uncured first bonding material and the uncured second bonding material, the first part to the first arrangement region via a first bonding material and the second part to the second arrangement region via a second bonding material, wherein the applying includes:

applying, by using a first mask in which a first opening having a shape corresponding to a shape of the first arrangement region is formed to cover a part of the front surface including the second arrangement region, the uncured first bonding material to the first arrangement region via the first opening; and before curing the uncured first bonding material, applying, by using a second mask in which a second opening having a shape corresponding to a shape of the second arrangement region is formed to cover a part of the front surface including the first arrangement region on which the uncured first bonding material has been applied, the uncured second bonding material to the second arrangement region via the second opening.

2. The semiconductor device manufacturing method according to claim 1, wherein
the first bonding material and the second bonding material are each solder, and
the second bonding material has a liquidus temperature, an amount of a flux material, and a component of the flux material, one of which is different from a corresponding one of a liquidus temperature, an amount of a flux material, or a component of the flux material of the first bonding material.

3. The semiconductor device manufacturing method according to claim 2, wherein
the first part is a semiconductor chip, and the second part is a wiring part, and
the amount of the flux material of the second bonding material is less than the amount of the flux material of the first bonding material.

4. The semiconductor device manufacturing method according to claim 3, wherein the first bonding material has the liquidus temperature approximately the same as the liquidus temperature of the second bonding material.

5. The semiconductor device manufacturing method according to claim 3, wherein the wiring part is a tubular contact part in which a hallow hole is formed, a contact pin, or a lead frame.

6. The semiconductor device manufacturing method according to claim 2, wherein
the first part is a semiconductor chip, and the second part is a wiring part, and
the liquidus temperature of the second bonding material is higher than the liquidus temperature of the first bonding material.

7. The semiconductor device manufacturing method according to claim 6, wherein the first bonding material has the amount of the flux material approximately same as the amount of the flux material of the second bonding material.

8. The semiconductor device manufacturing method according to claim 2, wherein the first part is a semiconductor chip, and the second part is a metal block, and the liquidus temperature of the second bonding material is lower than the liquidus temperature of the first bonding material.

9. The semiconductor device manufacturing method according to claim 8, wherein the first bonding material has the amount of the flux material approximately same as the amount of the flux material of the second bonding material.

10. The semiconductor device manufacturing method according to claim 2, wherein the first part is a semiconductor chip, and the second part is an electronic part, and the amount of the flux material of the second bonding material is less than the amount of the flux material of the first bonding material.

11. The semiconductor device manufacturing method according to claim 10, wherein the liquidus temperature of the second bonding material is lower than the liquidus temperature of the first bonding material.

12. The semiconductor device manufacturing method according to claim 1, wherein a thickness of the uncured first bonding material is less than a difference between a height of the first arrangement region measured from the rear surface and a height of the second arrangement region measured from the rear surface.

* * * * *